United States Patent
Lee et al.

(10) Patent No.: US 12,433,133 B2
(45) Date of Patent: Sep. 30, 2025

(54) DISPLAY DEVICE

(71) Applicant: Samsung Display Co., Ltd., Yongin-si (KR)

(72) Inventors: Geunwook Lee, Cheonan-si (KR); Kyungtae Kim, Hwaseong-si (KR); Boa Kim, Icheon-si (KR); Sang-Il Park, Yongin-si (KR); Sungguk An, Suwon-si (KR); Siyun Jung, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 665 days.

(21) Appl. No.: 17/565,298

(22) Filed: Dec. 29, 2021

(65) Prior Publication Data

US 2022/0310971 A1    Sep. 29, 2022

(30) Foreign Application Priority Data

Mar. 23, 2021   (KR) .................. 10-2021-0037476

(51) Int. Cl.
*H10K 59/80* (2023.01)
*H10K 50/844* (2023.01)
*H10K 59/40* (2023.01)
*H10K 102/00* (2023.01)

(52) U.S. Cl.
CPC .......... *H10K 59/87* (2023.02); *H10K 50/844* (2023.02); *H10K 59/40* (2023.02); *H10K 59/873* (2023.02); *H10K 59/8791* (2023.02); *H10K 2102/311* (2023.02)

(58) Field of Classification Search
CPC ................ H10K 50/844; H10K 59/40; H10K 2102/311; H10K 59/873; H10K 59/87; H10K 59/8791; H10K 77/111; H10K 50/84; G02B 1/04; G02B 1/14; G02B 1/18; G02B 5/208; G02B 5/3083; G09F 9/301

See application file for complete search history.

(56) References Cited

U.S. PATENT DOCUMENTS

| | | | |
|---|---|---|---|
| 2010/0134879 A1* | 6/2010 | Yoshihara | B32B 27/285 359/361 |
| 2018/0003860 A1* | 1/2018 | Cho | G02B 5/3016 |
| 2020/0194724 A1* | 6/2020 | Ahn | H10K 50/865 |
| 2021/0041601 A1* | 2/2021 | Oh | G06F 1/1609 |
| 2021/0118589 A1* | 4/2021 | Ooishi | H01B 1/00 |
| 2021/0257582 A1* | 8/2021 | Kim | B32B 7/02 |

FOREIGN PATENT DOCUMENTS

| | | |
|---|---|---|
| KR | 10-2008-0027186 | 3/2008 |
| KR | 10-1866784 B1 | 6/2018 |
| KR | 10-2097799 B1 | 4/2020 |
| KR | 10-2021-0018674 | 2/2021 |
| KR | 10-2021-0104514 | 8/2021 |

* cited by examiner

*Primary Examiner* — Kevin Quarterman
(74) *Attorney, Agent, or Firm* — Womble Bond Dickinson (US) LLP

(57) ABSTRACT

A protection film and a display device are provided. A protection film may include a base layer having a phase difference less than 100 nm, an inorganic layer on at least one of top and bottom surfaces of the base layer, and a surface coating layer on the base layer and including a hard coating material.

12 Claims, 12 Drawing Sheets
(1 of 12 Drawing Sheet(s) Filed in Color)

DISPLAY DEVICE

CROSS-REFERENCE TO RELATED APPLICATION

This application claims priority to and the benefit of Korean Patent Application No. 10-2021-0037476, filed on Mar. 23, 2021 in the Korean Intellectual Property Office, the entire content of which is hereby incorporated by reference.

BACKGROUND

1. Field

Aspects of embodiments of the present disclosure relate to a display device.

2. Description of the Related Art

An electronic device includes an active region that can be activated by an electrical signal. The electronic device includes a display surface, which is used to sense an input provided from the outside and to display various images to a user.

The electronic device further includes a window, which is used to protect the display surface from an external impact or a contamination material. The image displayed on the display surface is provided to a user through the window. The electronic device may further include an additional element, which is used to improve a mechanical or optical property of the window.

SUMMARY

According to an aspect of one or more embodiments of the present disclosure, a foldable display device is provided.

According to another aspect of one or more embodiments of the present disclosure, a protection film with improved visibility and moisture permeability resistance properties is provided.

According to another aspect of one or more embodiments of the present disclosure, a display device with improved reliability is provided.

According to one or more embodiments of the present disclosure, a protection film includes a base layer having a phase difference less than 100 nm, an inorganic layer on at least one of top and bottom surfaces of the base layer, and a surface coating layer on the base layer and including a hard coating material.

In an embodiment, the base layer may include at least one of tri-acetyl cellulose, polycarbonate, cyclo-olefin polymer, or poly(methyl methacrylate).

In an embodiment, the inorganic layer may be on the base layer.

In an embodiment, the inorganic layer may include a first inorganic layer on the base layer, and a second inorganic layer below the base layer.

In an embodiment, a water vapor permeability of the protection film may be less than 180 $g/m^2 \cdot day$.

In an embodiment, the inorganic layer may include at least one of Si, Al, or Nb.

In an embodiment, the inorganic layer may be in contact with a surface of the base layer.

In an embodiment, the base layer may be configured to be folded and unfolded along at least one folding axis.

In an embodiment, a thickness of the base layer may be from 10 μm to 60 μm.

In an embodiment, a thickness of the inorganic layer may be from 1 nm to 40 nm.

In an embodiment, the surface coating layer may further include an anti-fingerprint material.

In an embodiment, the base layer may include an ultra-violet blocking material.

In an embodiment, the surface coating layer may be on the inorganic layer.

According to one or more embodiments of the present disclosure, a display device includes a display module, a window on the display module, and a protection film on the window. The protection film may include a base layer having a phase difference less than 100 nm, an inorganic layer on at least one of top and bottom surfaces of the base layer, and a surface coating layer including a hard coating material.

In an embodiment, the window may be configured to be folded and unfolded along at least one folding axis.

In an embodiment, the base layer may include at least one of tri-acetyl cellulose, polycarbonate, cyclo-olefin polymer, or poly(methyl methacrylate).

In an embodiment, a water vapor permeability of the protection film may be less than 180 $g/m^2 \cdot day$.

In an embodiment, the protection film may further include an adhesive layer below the base layer.

In an embodiment, the display module may include a display panel and an input-sensing sensor.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments will be more clearly understood from the following brief description of some example embodiments taken in conjunction with the accompanying drawings. The accompanying drawings represent non-limiting, example embodiments as described herein.

Figure 1:
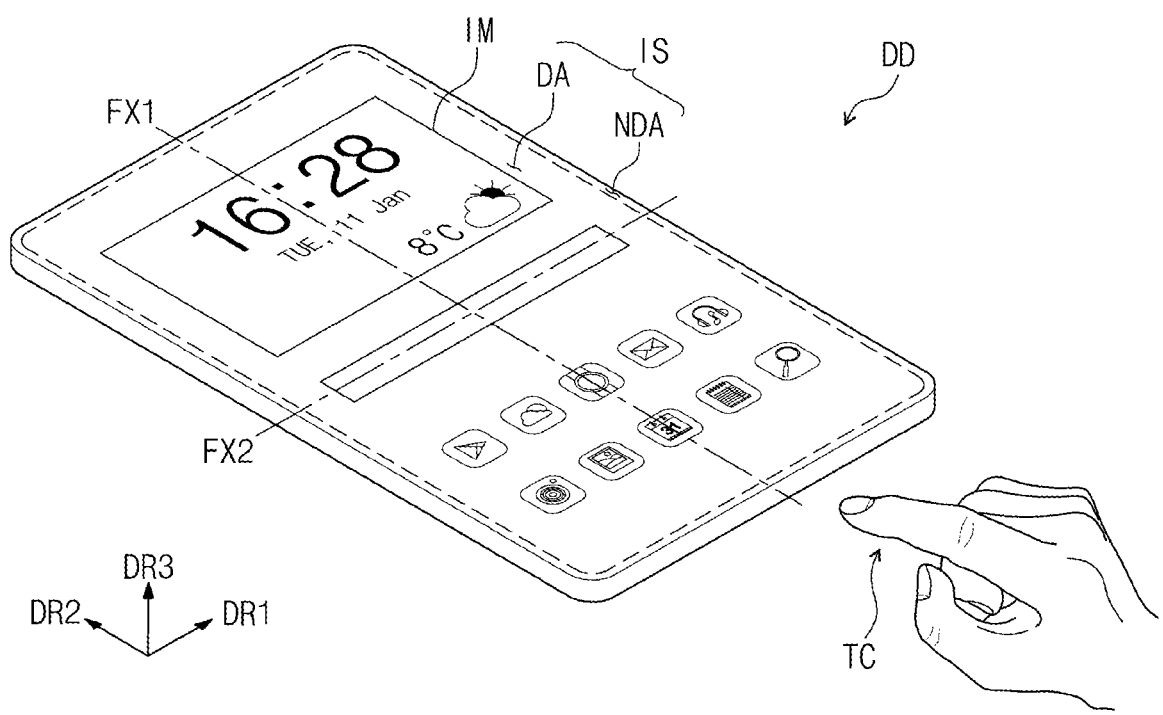
FIG. 1 is a perspective view illustrating a display device according to an embodiment of the inventive concept.

It should be noted that these figures are intended to illustrate the general characteristics of methods, structures, and/or materials utilized in certain example embodiments and to supplement the written description provided below. These drawings may not, however, be to scale and may not precisely reflect the precise structural or performance characteristics of any given embodiment, and should not be interpreted as defining or limiting the range of values or properties encompassed by embodiments. For example, the relative thicknesses and positioning of components, layers, regions, and/or structural elements may be reduced or exaggerated for clarity. The use of similar or same reference numbers in the various drawings is intended to indicate the presence of a similar or same element or feature.

DETAILED DESCRIPTION

Some example embodiments of the inventive concepts will now be described more fully with reference to the accompanying drawings, in which some example embodiments are shown. Embodiments of the inventive concepts may, however, be embodied in many different forms and should not be construed as being limited to the embodiments set forth herein; rather, these embodiments are provided so that this disclosure will be thorough and complete, and will fully convey the concept of embodiments to those of ordinary skill in the art. In the drawings, the thicknesses of layers and regions may be exaggerated for clarity. Like reference numerals in the drawings denote like elements, and thus their repeated description may be omitted.

It is to be understood that when an element is referred to as being "connected" or "coupled" to another element, it may be directly connected or coupled to the other element, or one or more intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below," for example, can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of embodiments. As used herein, the singular forms "a," "an," and "the" are intended to include the plural forms as well, unless the context clearly indicates otherwise. It is to be further understood that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Some example embodiments of the inventive concepts may be described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, embodiments of the inventive concepts should not be construed as limited to the particular shapes of regions illustrated herein, but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It is to be further understood that terms, such as those defined in commonly-used dictionaries, should be interpreted as having a meaning that is consistent with their meaning in the context of the relevant art and are not to be interpreted in an idealized or overly formal sense unless expressly so defined herein.

FIG. 1 is a perspective view illustrating a display device DD according to an embodiment of the inventive concept.

Referring to FIG. 1, in an embodiment, the display device DD may have a rectangular shape having short and long sides parallel to a first direction DR1 and a second direction DR2, respectively. However, the shape of the display device DD is not limited to this example.

In an embodiment, the display device DD may be a foldable display device. In further detail, the display device DD may be folded along a folding axis FX1 or FX2, each of which is extended in a specific direction. Herein, when the display device DD is folded along the folding axis FX1 or FX2, the display device DD will be described to be in a folding state, and when the display device DD is unfolded, the display device DD will be described to be in a non-folding state. The folding axis FX1 or FX2 may serve as a rotation axis, when the display device DD is folded.

The folding axis FX1 or FX2 may be extended in the first direction DR1 or the second direction DR2. One or more folding axes FX1 or FX2 may be provided. In an embodiment, the display device DD may include a first folding axis FX1 extending in the second direction DR2 and a second folding axis FX2 extending in the first direction DR1. In this case, the display device DD may be folded along either of the first and second folding axes FX1 and FX2.

FIG. 1 illustrates an example in which the display device DD is a smartphone, but the inventive concept is not limited to this example. For example, the display device DD may be any of large-sized display devices (e.g., television sets and monitors) or small- and medium-sized display devices (e.g., tablets, car navigation systems, and gaming machines).

As shown in FIG. 1, the display device DD may include a display surface IS that is parallel to both of the first and second directions DR1 and DR2. The display surface IS may be configured to display an image IM in a third direction DR3. The display surface IS, on which the image IM is displayed, may correspond to a front surface of the display device DD.

The display surface IS of the display device DD may include a plurality of regions. For example, the display surface IS of the display device DD may include a display region DA and a non-display region NDA.

The display region DA may be a region which is used to display the image IM, and a user may watch the image IM through the display region DA. In an embodiment, the non-display region NDA may be provided to enclose the display region DA. However, the inventive concept is not limited to this example, and, in an embodiment, the non-display region NDA may be provided near one side edge of the display region DA, for example, or may be omitted.

The non-display region NDA may be a region which is provided adjacent to the display region DA and is not used to display the image IM. A bezel region of the display device DD may be defined by the non-display region NDA.

The display device DD may sense an input TC of a user provided from the outside. The input TC may include any of various types of external inputs, such as a part of a body of a user, light, heat, or pressure. In the present embodiment, the input TC may be input to the display surface IS through a hand of a user, as shown in FIG. 1. However, the inventive concept is not limited to this example, and the input TC may be provided in any of various forms as described above. In addition, the display device DD may be configured to sense the input TC applied to a side or rear surface thereof, depending on its structure.

In the display device DD according to an embodiment of the inventive concept, the display surface IS may be activated to perform operations of displaying the image IM and sensing the input TC at the same time. In the present embodiment, a region, which is used to sense the input TC, is illustrated to be provided in the display region DA displaying the image IM. However, the inventive concept is not limited to this example, and, in an embodiment, the region which is used to sense the input TC may be provided in the non-display region NDA or throughout the display surface IS.

Figure 2A:
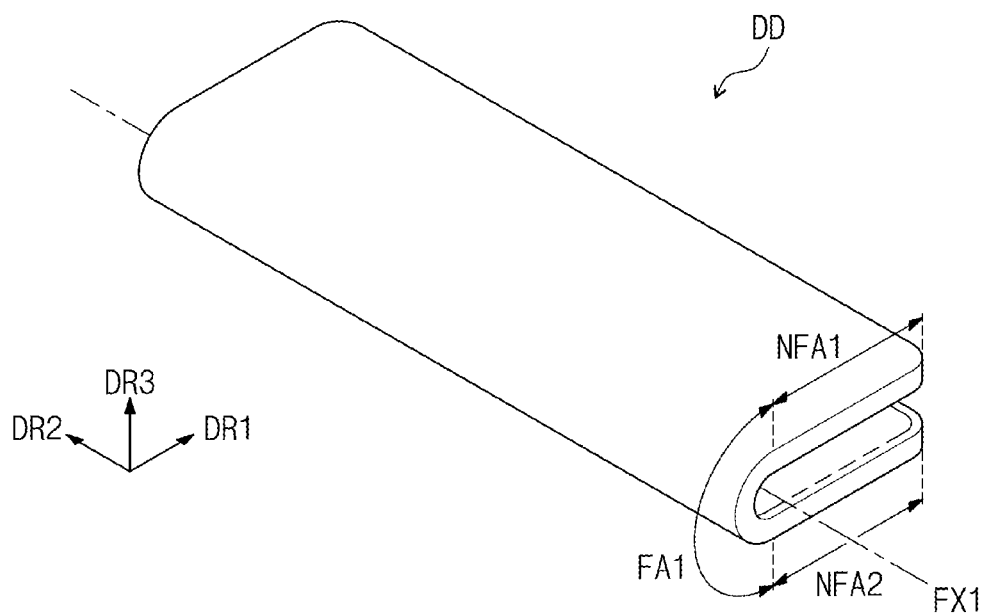
FIG. 2A is a perspective view illustrating the display device of FIG. 1, when it is folded along a first folding axis in an in-folding manner.
Figure 2B:
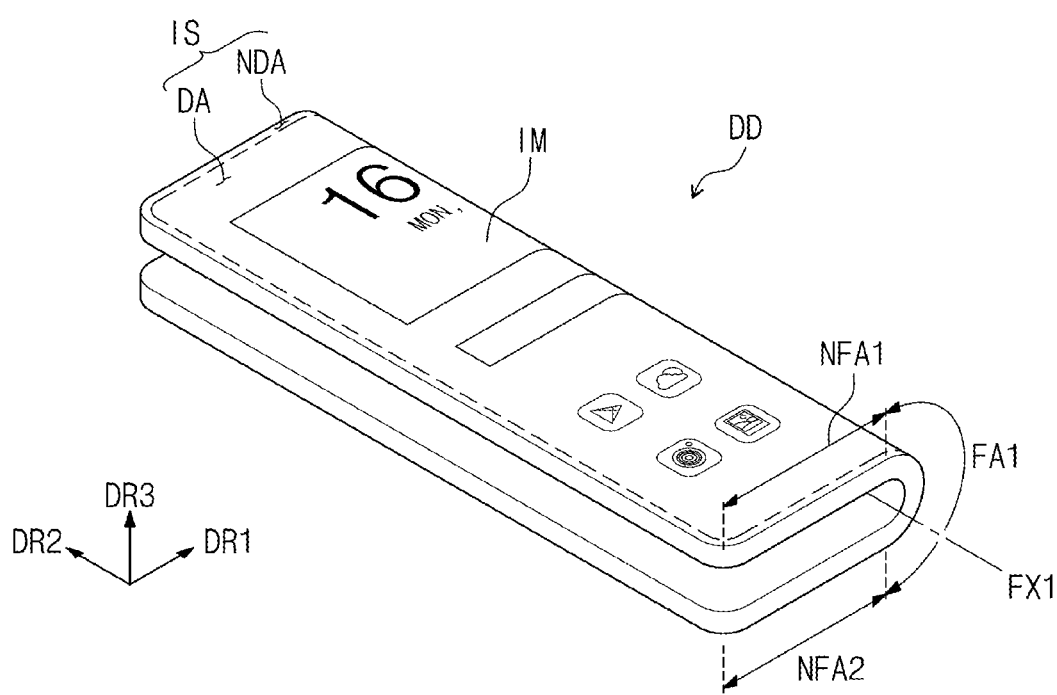
FIG. 2B is a perspective view illustrating the display device of FIG. 1, when it is folded along the first folding axis in an out-folding manner.

FIG. 2A is a perspective view illustrating the display device DD of FIG. 1, when it is folded along the first folding axis FX1 in an in-folding manner; and FIG. 2B is a perspective view illustrating the display device DD of FIG. 1, when it is folded along the first folding axis FX1 in an out-folding manner.

Referring to FIGS. 1 and 2A, the display device DD may be a foldable display device. The display device DD may be folded along the first folding axis FX1.

Depending on a method of manipulating the display device DD, a plurality of regions may be defined in the display device DD. The plurality of regions may include a folding region FA1 and at least one non-folding region NFA1 or NFA2. In an embodiment, the folding region FA1 may be defined between two non-folding regions NFA1 and NFA2.

The folding region FA1 may be a region which is folded along the first folding axis FX1 to have a substantially finite curvature. The first folding axis FX1 may be extended in the second direction DR2 (e.g., a direction parallel to a long axis of the display device DD). The folding region FA1 may be defined as a region that is folded along the first folding axis FX1 and is extended in the second direction DR2.

In an embodiment, the non-folding regions NFA1 and NFA2 may include a first non-folding region NFA1 and a second non-folding region NFA2. The first non-folding region NFA1 may be adjacent to a side of the folding region FA1 in the first direction DR1, and the second non-folding region NFA2 may be adjacent to an opposite side of the folding region FA1 in the first direction DR1.

The display device DD may be folded in an in-folding or out-folding manner. When the display device DD is folded such that the display surfaces of the non-folding regions NFA1 and NFA2 face each other, the display device DD will be described to be folded in the in-folding manner, and when the display device DD is folded such that the display surfaces of the non-folding regions NFA1 and NFA2 are exposed to the outside, the display device DD will be described to be folded in the out-folding manner.

In further detail, the term "in-folding" will be used to represent that the display device DD is folded in such a way that the display surfaces IS thereof face each other, and the term "out-folding" will be used to represent that the display device DD is folded in such a way that the rear surfaces thereof face each other.

The display device DD shown in FIG. 2A may be folded such that the display surface IS of the first non-folding region NFA1 faces the display surface IS of the second non-folding region NFA2. The display device DD may be folded in an in-folding manner such that the first non-folding region NFA1 rotates along the first folding axis FX1 in a clockwise direction. To align the first non-folding region NFA1 to the second non-folding region NFA2 in the in-folding operation of the display device DD, the first folding axis FX1 may be located at the center of the display device DD in the first direction DR1.

Referring to FIG. 2B, the display device DD may be folded along the first folding axis FX1 in the out-folding manner. The display device DD may display the image IM, when the display surfaces of the first and second non-folding regions NFA1 and NFA2 are exposed to the outside. In addition, the display surface of the folding region FA1, which is exposed to the outside, may also display the image IM. As shown in FIG. 1, the display device DD may display the image IM, when the display device DD is in the unfolded state. The first non-folding region NFA1, the second non-folding region NFA2, and the folding region FA1 may display images, respectively, which provide independent pieces of information to a user, or may display different portions of a single image, which provides a piece of information to the user.

The display device DD may be fabricated to realize both of the in-folding and out-folding operations or to realize one of the in-folding and out-folding operations.

Figure 3A:
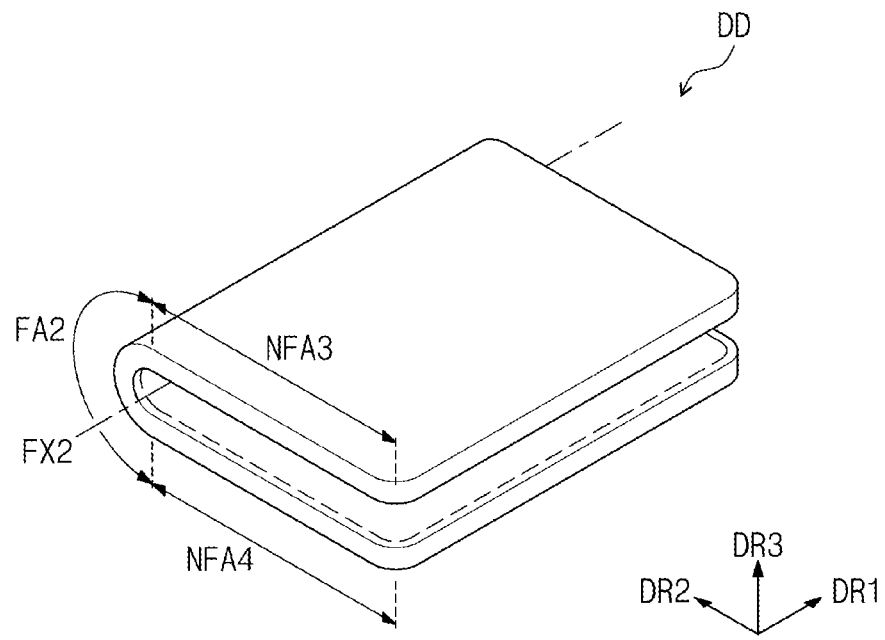
FIG. 3A is a perspective view illustrating the display device of FIG. 1, when it is folded along a second folding axis in an in-folding manner.
Figure 3B:
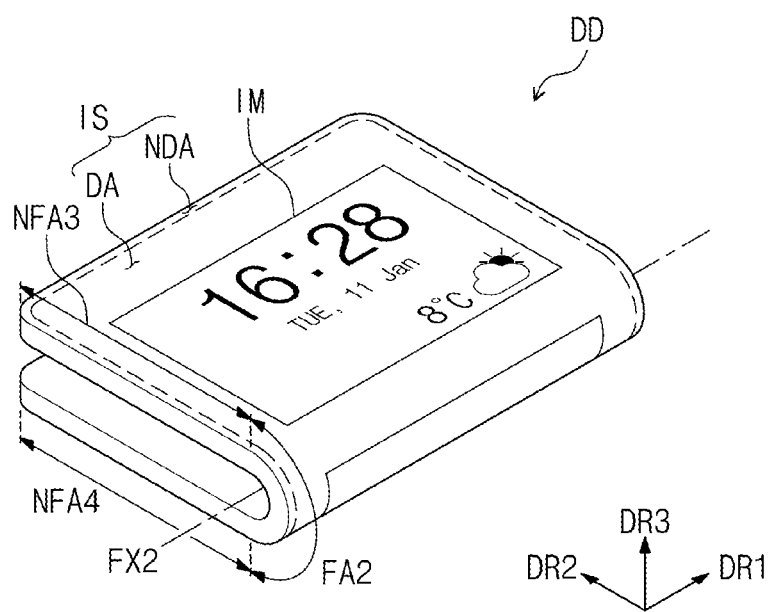
FIG. 3B is a perspective view illustrating the display device of FIG. 1, when it is folded along the second folding axis in an out-folding manner.

FIG. 3A is a perspective view illustrating the display device DD of FIG. 1, when it is folded along a second folding axis in an in-folding manner; and FIG. 3B is a perspective view illustrating the display device DD of FIG. 1, when it is folded along the second folding axis in an out-folding manner.

Referring to FIGS. 3A and 3B, the display device DD may be folded in an in-folding or out-folding manner along the second folding axis FX2. The second folding axis FX2 may be extended in the first direction DR1 (e.g., a direction of a short axis of the display device DD).

A plurality of regions may be defined in the display device DD, depending on an operation mode of the display device DD. The regions of the display device DD may include a folding region FA2 and at least one non-folding region NFA3 or NFA4. In an embodiment, the folding region FA2 may be defined between two non-folding regions NFA3 and NFA4.

The folding region FA2 may be a region, which is folded along the second folding axis FX2 to have a substantially finite curvature. The folding region FA2 may be defined as a region that is folded along the second folding axis FX2 and is extended in the first direction DR1.

In an embodiment, the non-folding regions NFA3 and NFA4 may include a third non-folding region NFA3 and a fourth non-folding region NFA4. The third non-folding region NFA3 may be adjacent to a side of the folding region FA2 in the second direction DR2, and the fourth non-folding region NFA4 may be adjacent to an opposite side of the folding region FA2 in the second direction DR2.

FIGS. 2A, 2B, 3A, and 3B illustrate an example of the display device DD, in which two folding regions FA1 and FA2 are defined, but the inventive concept is not limited to this example. For example, one or three or more folding regions may be defined in the display device DD.

Herein, an example in which the display device DD is folded along the second folding axis FX2 will be described.

Figure 4:
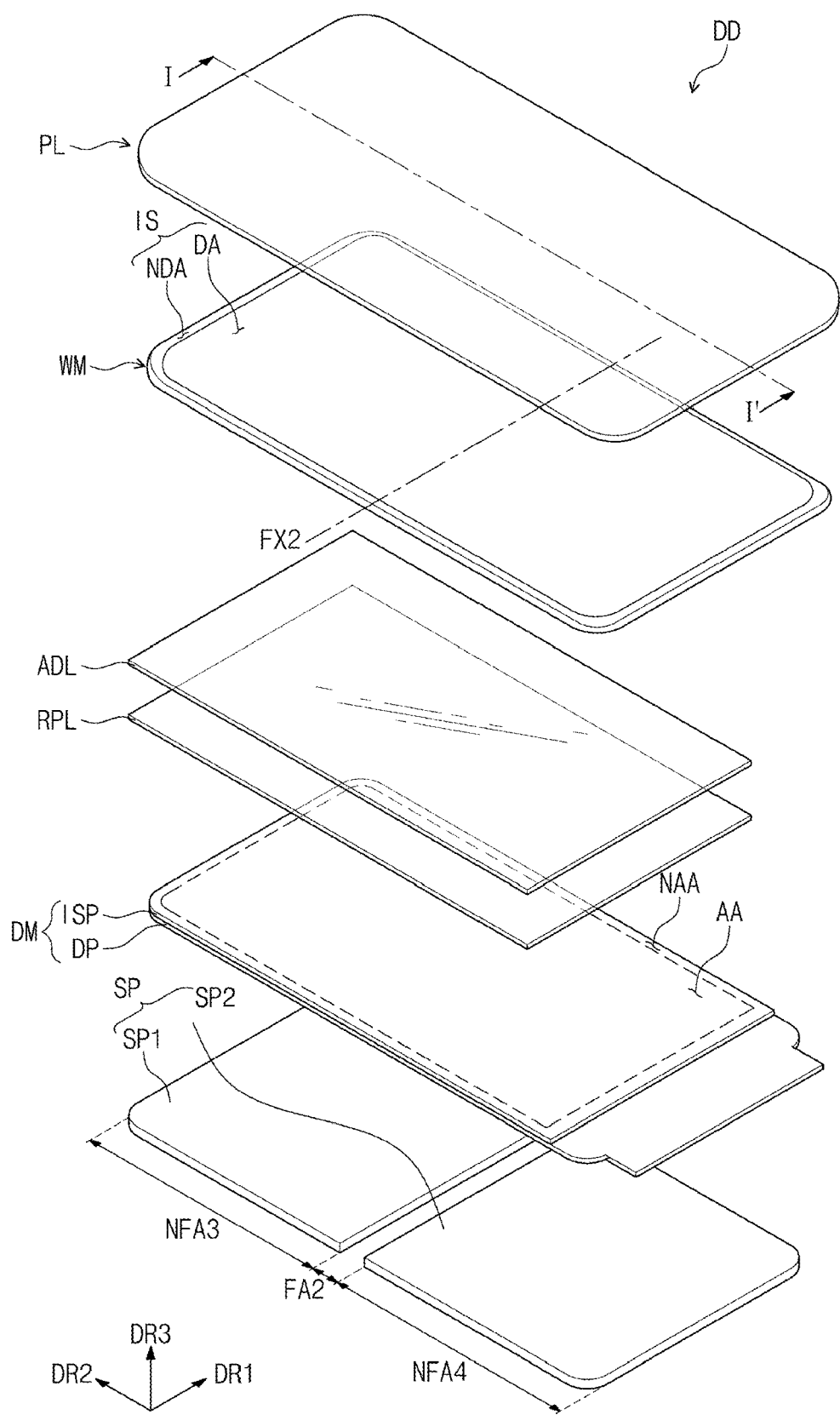
FIG. 4 is an exploded perspective view illustrating a display device according to an embodiment of the inventive concept.
Figure 5:
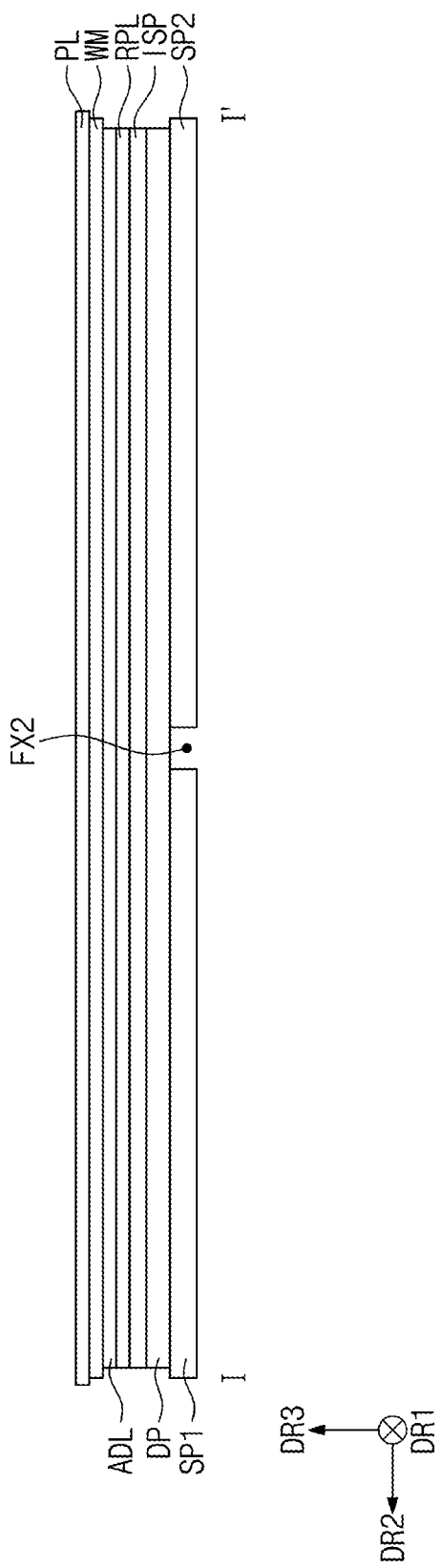
FIG. 5 is a cross-sectional view taken along the line I-I' of FIG. 4.

FIG. 4 is an exploded perspective view illustrating a display device according to an embodiment of the inventive concept; and FIG. 5 is a cross-sectional view taken along the line I-I' of FIG. 4.

Referring to FIGS. 4 and 5, the display device DD may include a display module DM displaying an image, a window WM disposed on the display module DM, and a protection film PL disposed on the window WM. The display module DM may be used as a part of the display device DD (e.g., of FIG. 1) to produce an image.

In an embodiment, the display module DM may include a display panel DP and an input-sensing sensor ISP. According to an embodiment of the inventive concept, the display panel DP may be a light-emitting type display panel, but the inventive concept is not limited to a specific type of the display panel DP. For example, the display panel DP may be an organic light-emitting display panel or a quantum dot light-emitting display panel. An emission layer of the organic light-emitting display panel may be formed of or include an organic luminescent material. An emission layer of the quantum dot light-emitting display panel may include a quantum dot, a quantum rod, or the like. The description that follows will refer to an example in which the display panel DP is the organic light-emitting display panel.

The display panel DP may be a flexible display panel. In an embodiment, the display panel DP may be wholly rolled or may be folded or unfolded along the second folding axis FX2.

The input-sensing sensor ISP may be disposed on the display panel DP. In an embodiment, the input-sensing sensor ISP may be directly disposed on the display panel DP. For example, the input-sensing sensor ISP may be formed on the display panel DP in a successive manner. In the present specification, an expression "directly disposed" will be used to represent that no other element is disposed between the input-sensing sensor ISP and the display panel DP.

However, the inventive concept is not limited to this example. For example, an adhesive film may be disposed between the input-sensing sensor ISP and the display panel DP. In this case, the input-sensing sensor ISP and the display panel DP may not be fabricated in a successive manner, and the input-sensing sensor ISP may be independently fabricated by a process distinct from that for the display panel DP and then may be attached to the top surface of the display panel DP by an adhesive film.

The display panel DP may be used to produce an image, and the input-sensing sensor ISP may be used to obtain information of coordinates of an input of a user (e.g., a touch event).

The window WM may be disposed on the display module DM. The window WM may be used to protect the display module DM from an external impact. The window WM may include an optically transparent insulating material. Accordingly, the image produced by the display module DM may be easily provided to a user through the window WM. Since the window WM is transparent to the image produced by the display module DM and is used to absorb an external impact, it is possible to prevent or substantially prevent the display module DM from being damaged or malfunction by the external impact. The external impact may be a force, which may be pressure or stress and is exerted from the outside of the display module DM to cause defects in the display module DM.

In an embodiment, the window WM may be formed of or include at least one of glass or synthetic resins.

For example, the window WM may be formed of or include at least one of glass, polyimide (PI), or polyethylene terephthalate (PET). For example, the window WM may be a thin glass film or a synthetic resin film.

In an embodiment, a thickness of the window WM may be less than 80 μm and may be, for example, 30 μm, but the thickness of the window WM is not limited to this value.

The window WM may have a multi- or single-layered structure. For example, the window WM may include a plurality of synthetic resin films, which are combined to each other by an adhesive material, or a glass substrate and a synthetic resin film, which are combined to each other by an adhesive material. The window WM may be formed of a flexible material. Accordingly, the window WM may be folded along the second folding axis FX2 or may be unfolded. In other words, when the shape of the display module DM is changed, the shape of the window WM may also be changed.

The protection film PL may be disposed on the window WM. The protection film PL may protect the window WM from an external impact, moisture, or the like.

According to an embodiment of the inventive concept, the protection film PL may be provided to have a small phase difference, and, in this case, the visibility of the display device DD may be improved. In addition, the protection film PL according to an embodiment of the inventive concept may have an improved moisture permeability resistance property. The structure of the protection film PL will be described in further detail below.

At least one functional layer may be disposed between the display module DM and the window WM. As an example, the functional layer may include an anti-reflection layer RPL which is used to block an external light. The anti-reflection layer RPL may prevent or substantially prevent components constituting the display module DM from being recognized by a user, when an external light is incident through the front surface of the display device DD. The anti-reflection layer RPL may include a phase retarder and a polarizer. The phase retarder may be of a film type or a liquid crystal coating type and may include a $\lambda/2$ and/or a $\lambda/4$ phase retarder. The polarizer may also be of a film type or a liquid crystal coating type. The polarizer of the film type may include a stretched synthetic resin film, whereas the polarizer of the liquid crystal coating type may include liquid crystals arranged with a specific orientation. In an embodiment, the phase retarder and the polarizer may be realized using a single polarizer film. The functional layer may further include a protection film which is disposed on or below the anti-reflection layer RPL.

The anti-reflection layer RPL may be disposed on the input-sensing sensor ISP. In other words, the anti-reflection layer RPL may be disposed between the input-sensing sensor ISP and the window WM. The anti-reflection layer RPL and the window WM may be combined to each other by an adhesive film ADL. Although not shown in the drawings, an adhesive film may be further disposed between the input-sensing sensor ISP and the anti-reflection layer RPL.

The adhesive film ADL may include an optically clear adhesive film (OCA). However, the adhesive film ADL is not limited thereto and may include at least one of typical gluing or adhesive agents. For example, the adhesive film ADL may include an optically clear resin (OCR) film or a pressure-sensitive adhesive (PSA) film.

The display module DM may display an image in response to electrical signals applied thereto and may receive and output information of an external input. An active region AA and a peripheral region NAA may be defined in the display module DM. The active region AA may be defined as a region through which an image produced by the display module DM is emitted.

The peripheral region NAA may be adjacent to the active region AA. For example, the peripheral region NAA may enclose the active region AA. However, the inventive concept is not limited to this example, and the shape of the peripheral region NAA may be variously changed. In an embodiment, the active region AA of the display module DM may correspond to at least a portion of the display region DA.

As shown in FIGS. 4 and 5, the display device DD may further include a supporting plate SP, which is disposed on the rear surface of the display module DM to support the display module DM. In an embodiment, the supporting plate SP may be a metal plate. For example, the supporting plate SP may be a stainless steel plate. The supporting plate SP may have a mechanical strength that is greater than that of the display module DM.

The supporting plate SP may include supporting plates SP1 and SP2, which are provided to correspond to the non-folding regions NFA3 and NFA4, respectively. For example, the supporting plate SP may include a first supporting plate SP1 and a second supporting plate SP2, which are spaced apart from each other. The first and second supporting plates SP1 and SP2 may be disposed to correspond to the non-folding regions NFA3 and NFA4, respectively. In other words, the first supporting plate SP1 may be disposed to correspond to the third non-folding region NFA3 of the display module DM, and the second supporting plate SP2 may be disposed to correspond to the fourth non-folding region NFA4 of the display module DM. In the case in which the display module DM is folded along the second folding axis FX2, the first and second supporting plates SP1 and SP2 may be disposed to be spaced apart from each other in the second direction DR2.

The first and second supporting plates SP1 and SP2 may be spaced apart from each other near the folding region FA2. In an embodiment, the first and second supporting plates SP1 and SP2 may be partially overlapped with the folding region FA2. That is, when measured in the second direction DR2, a distance between the first and second supporting plates SP1 and SP2 may be smaller than a width of the folding region FA2.

The supporting plate SP may further include a connection module, which is used to connect the first and second supporting plates SP1 and SP2 to each other. The connection module may include a hinge module or a multiple-joint module.

The supporting plate SP is illustrated to include two supporting plates SP1 and SP2, but the inventive concept is not limited to this example. For example, in a case in which the number of the folding axes is increased, the supporting plate SP may include a plurality of supporting plates which are divided based on the folding axes.

FIG. 4 illustrates an example in which the supporting plate SP is divided into the first and second supporting plates SP1 and SP2, but the inventive concept is not limited to this example. For example, the supporting plate SP may be a plate-shaped structure that is disposed throughout the first and second non-folding regions NFA3 and NFA4 and the folding region FA2. In an embodiment, the supporting plate SP may be provided to have a plurality of holes, which are formed in the folding region FA2 to penetrate the supporting plate SP.

In an embodiment, a buffering film may be further disposed between the display module DM and the supporting plate SP. The buffering film may be formed of or include a polymer material. The buffering film may be configured to absorb an impact exerted from the outside. The buffering film may be coupled to the display module DM and the supporting plate SP by one or more adhesive films.

Figure 6A:
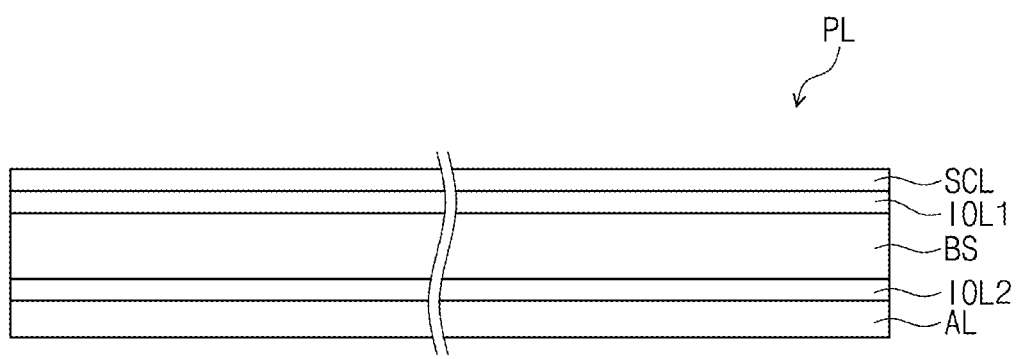
FIG. 6A is a cross-sectional view illustrating a protection film according to an embodiment of the inventive concept.
Figure 6B:
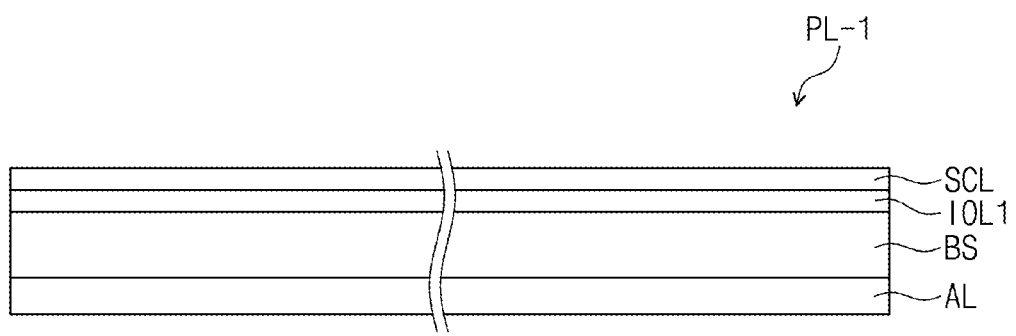
FIG. 6B is a cross-sectional view illustrating a protection film according to an embodiment of the inventive concept.
Figure 7:
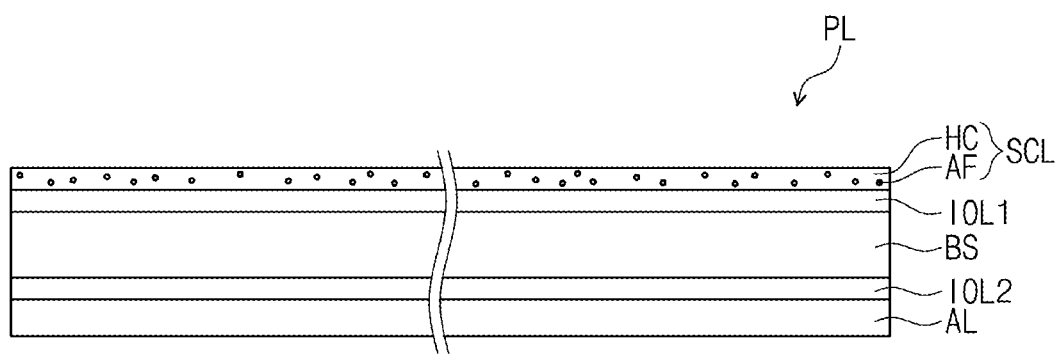
FIG. 7 is a cross-sectional view illustrating a protection film according to an embodiment of the inventive concept.
Figure 8:
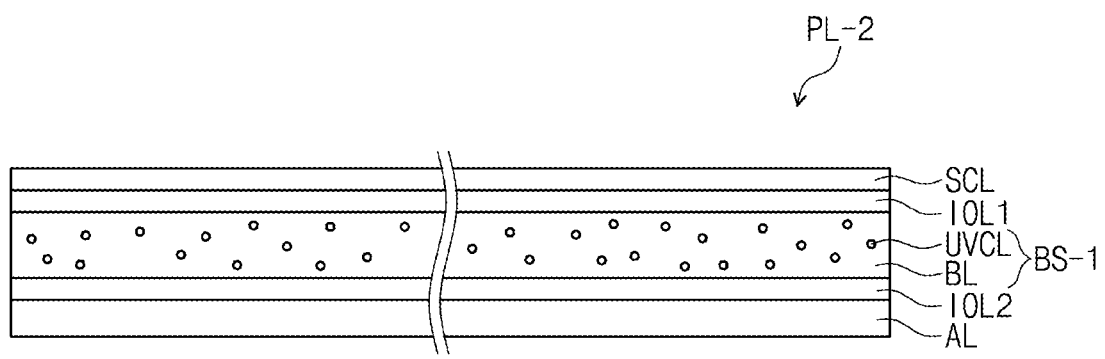
FIG. 8 is a cross-sectional view illustrating a protection film according to an embodiment of the inventive concept.

FIG. 6A is a cross-sectional view illustrating the protection film PL according to an embodiment of the inventive concept. FIG. 6B is a cross-sectional view illustrating a protection film PL-1 according to an embodiment of the inventive concept. FIG. 7 is a cross-sectional view illustrating the protection film PL according to an embodiment of the inventive concept. FIG. 8 is a cross-sectional view illustrating a protection film PL-2 according to an embodiment of the inventive concept.

Referring to FIG. 6A, the protection film PL may include a base layer BS, an inorganic layer IOL1 or IOL2, which is disposed on or under the base layer BS, and a surface coating layer SCL, which is disposed on the base layer BS. The protection film PL may further include an adhesive agent layer AL, which is disposed below the base layer BS. The protection film PL may be fixedly attached to the window WM (e.g., see FIG. 4) by the adhesive agent layer AL. In an embodiment, a thickness of the adhesive agent layer AL may be in a range from 10 μm to 50 μm and, in an embodiment, from 25 μm to 35 μm. For example, the adhesive agent layer AL may include an acrylic-based adhesive agent. However, the inventive concept is not limited to this example, and, in an embodiment, the adhesive agent layer AL may include an optically clear resin.

The base layer BS may have a phase difference of 100 nm or less. In an embodiment, the phase difference of the base layer BS may be less than 50 nm and may be, for example, 10 nm.

The base layer BS may be an element including a small phase difference material. For example, the base layer BS may be formed of or include at least one of tri-acetyl cellulose (TAC), polycarbonate (PC), cyclo-olefin polymer (COP), or poly(methyl methacrylate) (PMMA). In the case in which the base layer BS includes TAC, the phase difference of the base layer BS may be less than, for example, 10 nm.

Since, as previously described with reference to FIGS. 3A, 3B, and 4, the display device DD may be folded or unfolded along the second folding axis FX2, the protection film PL in the display device DD may be provided to have a flexible property. In further detail, the base layer BS may be folded and unfolded along the folding axis. For example, the base layer BS may be folded and unfolded along the second folding axis FX2.

In an embodiment, a thickness of the base layer BS may be in a range from 10 μm to 60 μm. For example, the thickness of the base layer BS may be in a range from 23 μm to 50 μm, or may be 40 μm. If the thickness of the base layer BS is larger than 60 μm, the base layer BS may have a poor folding property, and, in this case, there may be a difficulty in folding or unfolding the display device DD. By contrast, if the thickness of the base layer BS is less than 10 μm, there may be a difficulty in performing a surface treatment process on the protection film PL.

The inorganic layer IOL1 or IOL2 may be disposed on at least one of the top and bottom surfaces of the base layer BS. For example, the inorganic layer IOL1 or IOL2 may be provided to be in contact with a surface of the base layer BS. In an embodiment, the inorganic layer IOL1 or IOL2 may be formed by coating the surface of the base layer BS with an inorganic material. In an embodiment, the inorganic layer IOL1 or IOL2 may be formed of or include at least one of silicon (Si), aluminum (Al), or niobium (Nb).

The inorganic layer IOL1 or IOL2 may be disposed on both of the top and bottom surfaces of the base layer BS or may be disposed on only the top surface of the base layer BS.

Referring to FIG. 6A, the inorganic layers IOL1 and IOL2 may include a first inorganic layer IOL1, which is disposed on the base layer BS, and a second inorganic layer IOL2, which is disposed below the base layer BS. The first inorganic layer IOL1 may be disposed between the surface coating layer SCL and the base layer BS. The second inorganic layer IOL2 may be disposed between the base layer BS and the adhesive agent layer AL.

Referring to FIG. 6B, the protection film PL-1 may include the first inorganic layer IOL1, which is disposed on the base layer BS, but may not have the second inorganic layer IOL2 disposed below the base layer BS. However, the inventive concept is not limited to this example.

Since the protection film PL includes the inorganic layer IOL1 or IOL2, the protection film PL may have an improved moisture permeability resistance property. For example, the protection film PL may be configured to have a water vapor permeability of 180 g/m²·day or less. In a case in which the water vapor permeability of the protection film PL is higher than 180 g/m²·day, a delamination phenomenon may occur between elements constituting the protection film.

Referring back to FIG. 6A, a thickness of the inorganic layer IOL1 or IOL2 may be in a range from 1 nm to 40 nm and, in an embodiment, from 5 nm to 30 nm. The first inorganic layer IOL1 and the second inorganic layer IOL2 may have the same thickness or may have thicknesses different from each other. For example, the thickness of the first inorganic layer IOL1 may be 7 nm, and the thickness of the second inorganic layer IOL2 may be 15 nm.

In a case in which the thickness of the inorganic layer IOL1 or IOL2 is larger than 40 nm, a folding property of the display device DD may be deteriorated, and, in a case in which the thickness is less than 1 nm, moisture permeability resistance of the protection film PL may be deteriorated.

The surface coating layer SCL may be formed of or include a hard coating material and may be disposed on the base layer BS. For example, the surface coating layer SCL may be disposed on the first inorganic layer IOL1, which is provided on the base layer BS.

Referring to FIG. 7, the surface coating layer SCL may include a hard coating material HC and an anti-fingerprint material AF.

The surface coating layer SCL may be a single layer or a plurality of layers. For example, the surface coating layer SCL may be a single layer that contains the hard coating material HC and the anti-fingerprint material AF. In the case in which the surface coating layer SCL is provided in the form of a single layer, it is possible to prevent or substantially prevent a failure related to an outer appearance of the protection film PL (e.g., a delamination issue of an anti-fingerprint layer). However, the inventive concept is not limited to this example, and, in an embodiment, the surface coating layer SCL may include two different layers, one of which contains the hard coating material HC and the other of which contains the anti-fingerprint material AF.

The hard coating material HC may contain a highly hard material having a hardness higher than pencil hardness F. For example, the hard coating material HC may include at least one of siloxane resins, epoxy resins, or acrylic resins.

In an embodiment, the siloxane resin may include silsesquioxane, a siloxane compound, and an inorganic particle whose surface is treated with silane. The silsesquioxane may be ladder type silsesquioxane. In an embodiment, the silsesquioxane may be provided to have a content of 30 wt % to 60 wt % of the total weight of the hard coating material HC. In a case in which the content of the silsesquioxane is less than 30 wt %, there may be a difficulty in improving the flexibility of the surface coating layer SCL, and, in a case in which the content of the silsesquioxane is higher than 60 wt %, the surface hardness property of the surface coating layer SCL may be deteriorated.

The siloxane compound may have at least one acrylate functional group. For example, the siloxane compound may be a compound that has an acrylate group as its end group. For example, the siloxane compound may be siloxane polymer or siloxane oligomer that has an acrylate group as its end group. In an embodiment, the siloxane compound may be provided as a polymer that is formed to form a single substance in conjunction with silsesquioxane.

In an embodiment, the siloxane compound may be provided to have a content of 10 wt % to 40 wt % of the total weight of the hard coating material HC. If the content of the siloxane compound is less than 10 wt %, the surface hardness and mechanical strength of the surface coating layer SCL may be deteriorated. If the content of the siloxane compound is higher than 40 wt %, the brittleness of the surface coating layer SCL may be increased, and, in this case, the surface coating layer SCL may have a poor flexible property and may be cracked when bent.

In an embodiment, the hard coating material HC may be provided to contain surface-treated inorganic particles. The surface-treated inorganic particle may be an inorganic particle having a surface treated with silane. In an embodiment, the inorganic particle having a surface treated with silane may be an inorganic particle having a surface treated with a silane coupling agent. For example, a mean size of the inorganic particle may be in a range from 10 nm to 50 nm. The mean size of the inorganic particle may represent a mean diameter of the inorganic particle. In an embodiment, the mean diameter of the inorganic particle may be in a range from 10 nm to 30 nm.

In a case in which the mean size of the inorganic particle is greater than 50 nm, optical transparency of the surface coating layer SCL may be deteriorated. In addition, in a case in which the mean size of the inorganic particle is less than 10 nm, the surface hardness improvement effect in the surface coating layer SCL may be deteriorated.

In an embodiment, the inorganic particle may be formed of or include $SiO_2$, $TiO_2$, $Al_2O_3$, $ZrO_2$, ZnO, AlN, $Si_3N_4$, or combinations thereof. For example, the inorganic particle may include a particle containing at least one of $SiO_2$, $TiO_2$, $Al_2O_3$, $ZrO_2$, ZnO, AlN, and $Si_3N_4$. The hard coating material HC may include $SiO_2$ having a surface treated with silane, $TiO_2$ having a surface treated with silane, $Al_2O_3$ having a surface treated with silane, $ZrO_2$ having a surface treated with silane, ZnO having a surface treated with silane, AlN having a surface treated with silane, $Si_3N_4$ having a surface treated with silane, or mixtures thereof.

In an embodiment, in the hard coating material HC, the inorganic particle having a surface treated with silane may be provided to have a content of 10 wt % to 30 wt %. In a case in which the content of the inorganic particle is less than 10 wt %, the surface hardness and mechanical strength of the surface coating layer SCL may be deteriorated, and, in a case in which the content of the inorganic particle is higher than 30 wt %, there may be a difficulty in commercializing the inorganic particle.

The epoxy resins or acrylic resins may be a monomer or oligomer that contains at least one of epoxy group, oxetane group, acrylate group, methacrylate group, urethane acrylate group, and ethylene oxide (EO) added acrylate group, and may have a flexible property. In an embodiment, the epoxy resins may be at least one that is selected from the group consisting of glycidyl type epoxy resins, aliphatic-type epoxy resins, and oxetane-based resins.

The glycidyl type epoxy resins may be any of bisphenol A-type epoxy resins, bisphenol F-type epoxy resins, bisphenol S-type epoxy resins, naphthalene-type epoxy resins or hydrogen-added materials thereof, epoxy resins having a dicyclopentadiene structure, epoxy resins having a triglycidylisocyanurate structure, epoxy resins having a cardo structure, and epoxy resins having a polysiloxane structure.

The aliphatic-type epoxy resins may be any of 3,4-epoxycyclohexyl methyl-3',4'-epoxycyclohexanecarboxylate, 1,2,8,9-diepoxylimonene, ε-caprolactone oligomer whose opposite ends are ester-bonded with 3,4-epoxycyclohexylmethanol and 3,4-epoxycyclohexanecarboxylic acid, and epoxy resins having a hydrogen-added bisphenol A structure.

The oxetane-based resins may be an oxetane resin having a hydroxy structure and an oxetane resin having a methoxy methyl benzene structure.

The acrylic resins may be a monomer or oligomer that contains one selected from the group consisting of acrylate group, methacrylate group, urethane acrylate group, and ethylene oxide (EO)-added acrylate group.

For example, the acrylic resins may be any of bisphenol-A ethylene oxide dimethacrylate, bisphenol-A ethoxylate diacrylate, bisphenol-A polyethoxylate diacrylate, bisphenol-A diacrylate, bisphenol-S diacrylate, dicyclopentadienyl diacrylate, pentaerythritol triacrylate, tris(2-hydroxyethyl)isocyanurate triacrylate, pentaerythritol tetraacrylate, bisphenol-A dimethacrylate, bisphenol-S dimethacrylate, dicyclopentadienyl dimethacrylate, pentaerythritol trimethacrylate, tris(2-hydroxyethyl)isocyanurate trimethacrylate, and pentaerythritol tetramethacrylate.

The anti-fingerprint material AF may include a water-repellent material or an oil-repellent material, and, in this case, the stain-resistant property of the surface coating layer SCL may be improved. As an example, the anti-fingerprint material AF may be an inorganic particle containing a fluorine-based material. The fluorine-based material may include any of polytetra fluoroethylene (PTFE), poly(vinylidene fluoride) (PVDF), and amorphous fluoropolymer (Teflon AF, Cytop).

Due to the anti-fingerprint material AF, a contact angle of the surface coating layer SCL may be greater than 110°. The surface contact angle may vary depending on a weight percent of the anti-fingerprint material AF to the surface coating layer SCL. As an example, a content of the anti-fingerprint material AF to the total weight of the surface coating layer SCL may be higher than 0 wt % and lower than 10 wt %. In a case in which the content of the anti-fingerprint material AF is higher than 10 wt %, the surface hardness property of the surface coating layer SCL may be deteriorated.

In an embodiment, the surface coating layer SCL may have a thickness in a range from 3 μm to 10 μm. In an embodiment, the thickness of the surface coating layer SCL may be in a range from 4 μm to 6 μm or may be, for example, 5 μm. However, the thickness of the surface coating layer SCL is not limited to this range or value. In a case in which the thickness of the surface coating layer SCL is larger than 10 μm, the flexibility may be deteriorated, and, in a case in which the thickness of the surface coating layer SCL is less than 3 μm, the surface hardness property of the surface coating layer SCL may be deteriorated.

Referring to FIG. 8, the protection film PL-2 may further include an ultraviolet blocking material. For example, a base layer BS-1 may include a base material BL and an ultraviolet blocking material UVCL. The base material BL may be at least one of the small phase difference materials described above. For example, the base material BL may include at least one of tri-acetyl cellulose (TAC), polycarbonate (PC), cyclo-olefin polymer (COP), or poly(methyl methacrylate) (PMMA).

The ultraviolet blocking material UVCL may include an inorganic material (e.g., zinc oxide (ZnO) or titanium dioxide ($TiO_2$)). The ultraviolet blocking material UVCL may be used to reflect or scatter an ultraviolet light. Since the base layer BS-1 contains the ultraviolet blocking material UVCL, the protection film PL-2 may have an ultraviolet blocking function. For example, the protection film PL-2 may have transmittance of 20% or lower to an ultraviolet light whose wavelength is shorter than 380 nm. In the case in which the window WM includes a thin glass film, the window WM may exhibit a poor ultraviolet blocking property. Even in this case, in the case in which the base layer BS-1 contains the ultraviolet blocking material, it is possible to effectively block the ultraviolet light by the protection film PL-2.

In an embodiment, the protection film PL may have an elastic modulus in a range from 4.0 GPa to 5.5 GPa. The protection film PL may be a stretched film with a controlled optic axis. In an embodiment, a difference between elastic moduli on first and second stretching axes of the protection film PL may be smaller than 2 GPa (e.g., smaller than 1.1 GPa). In a case in which the difference between elastic moduli on first and second stretching axes of the protection film PL is greater than 2 GPa, contractile deformation of the protection film PL may be increased.

In an embodiment, the protection film PL may have a total optical transmittance of 90% or higher, a yellowness index (YI) of 2% or lower, and a haze value of 0.5% or lower. In the case in which the protection film PL is provided to be within the above-described ranges, an optical transmission property of the protection film PL may be improved.

The protection film PL may have a surface resistance of $10^{11}$ Ω/m² or smaller. In the case in which the protection film PL is provided to be within the range, an electrostatic discharge resistance property of the protection film PL may be improved.

Figure 9A:
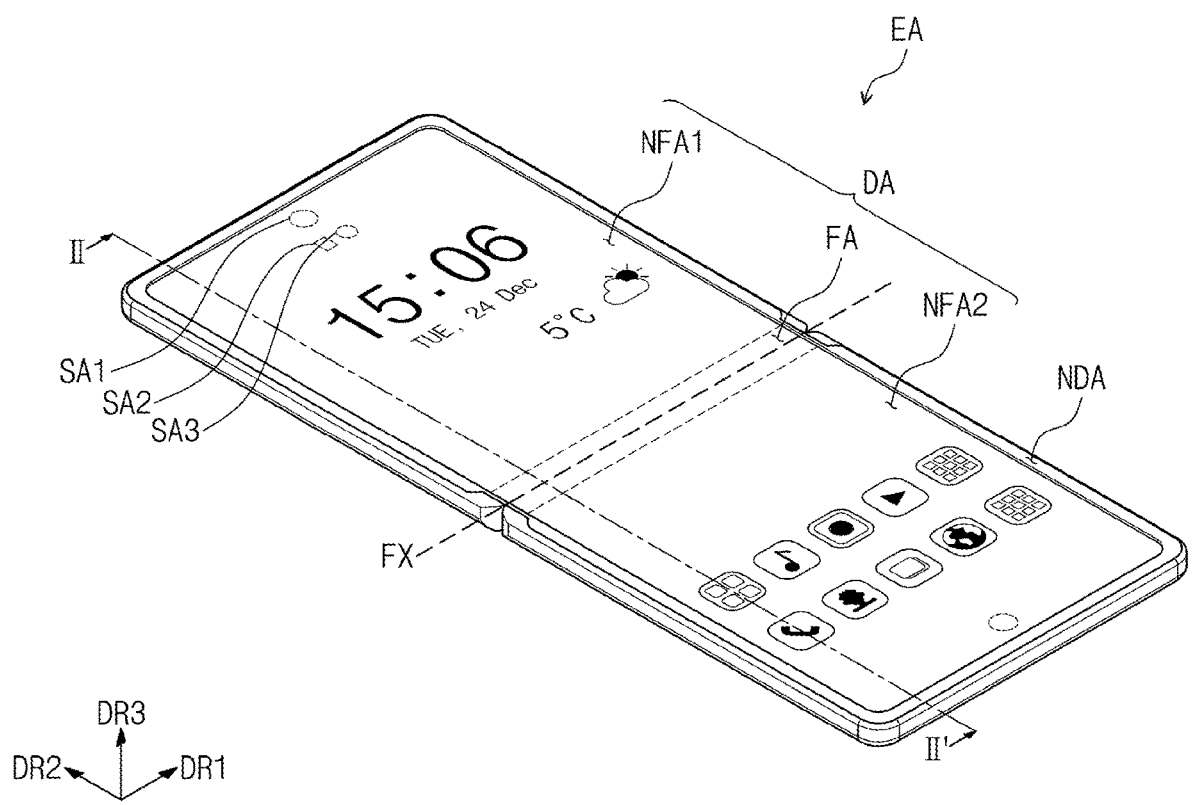
FIG. 9A is a perspective view illustrating an electronic device according to an embodiment of the inventive concept.
Figure 9B:
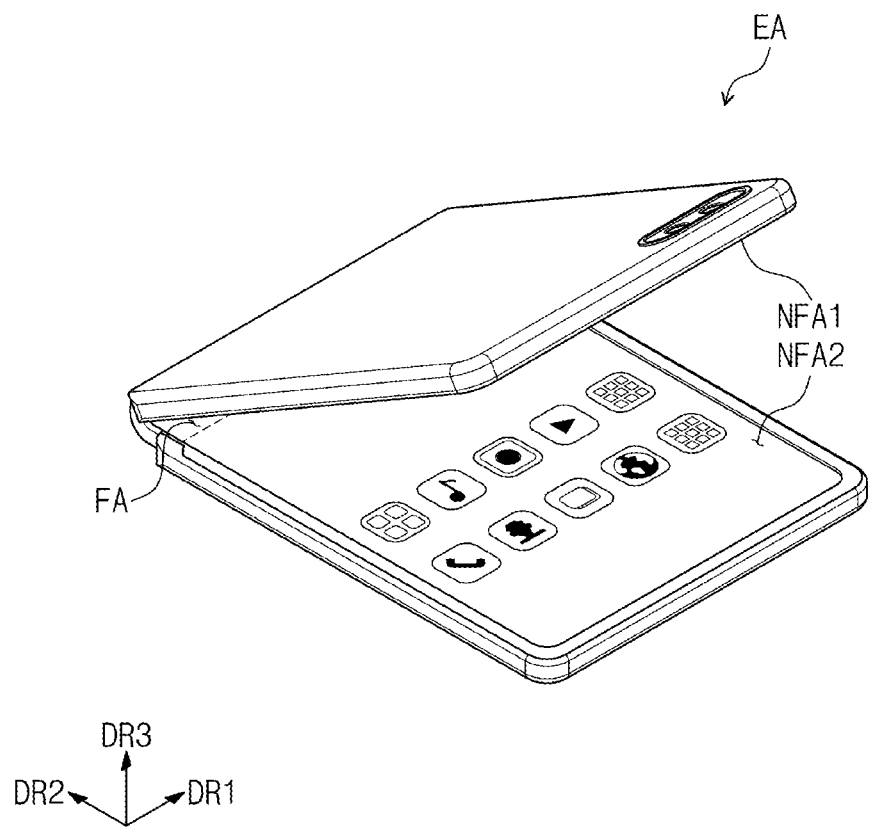
FIG. 9B is a perspective view illustrating an electronic device according to an embodiment of the inventive concept.

FIG. 9A is a perspective view illustrating an electronic device EA according to an embodiment of the inventive concept. FIG. 9B is a perspective view illustrating the electronic device EA according to an embodiment of the inventive concept. FIG. 9A illustrates the electronic device EA in an unfolded state, and FIG. 9B illustrates the electronic device EA in a folded state.

Referring to FIGS. 9A and 9B, the electronic device EA may be activated by an electrical signal applied thereto. For example, the electronic device EA may be a cellular phone, a tablet, a car navigation system, a gaming machine, or wearable device, but the inventive concept is not limited to these examples. FIG. 9A illustrates an example in which a cellular phone is used as the electronic device EA.

The electronic device EA may be configured to display an image through the display region DA. In an embodiment, the display region DA may be enclosed by the non-display region NDA. When the electronic device EA is in its unfolded state, the display region DA may include a flat surface that is defined by the first direction DR1 and the second direction DR2.

The display region DA may include a folding region FA and first and second non-folding regions NFA1 and NFA2. The folding region FA may be bent along a folding axis FX extending in the first direction DR1. The folding region FA may be disposed between the first and second non-folding regions NFA1 and NFA2.

When the electronic device EA is folded, the first and second non-folding regions NFA1 and NFA2 may face toward each other. Thus, when the electronic device EA is in a completely folded state, the display region DA may not be exposed to the outside, and this state may be referred to as an in-folding state. However, this is merely an example, and the operation of the electronic device EA is not limited thereto.

By contrast, the electronic device EA may be folded in such a way that the display region DA is exposed to the outside, and this state may be referred to as an out-folding state.

FIGS. 9A and 9B illustrate an example in which one folding region FA and two non-folding regions NFA1 and NFA2 are provided, but the numbers of the folding and non-folding regions are not limited to this example. For example, the electronic device EA may include two or more non-folding regions and a plurality of folding regions, which are disposed between adjacent ones of the non-folding regions.

FIGS. 9A and 9B illustrate an example in which the folding axis FX is parallel to a short axis of the electronic device EA, but the inventive concept is not limited to this example. For example, the folding axis FX may be extended in a direction parallel to a long axis of the electronic device EA (e.g., in the second direction DR2).

A plurality of sensing regions SA1, SA2, and SA3 may be defined in the electronic device EA. FIG. 9A illustrates an example in which three sensing regions SA1, SA2, and SA3 are defined, but the number of the sensing regions is not limited to this example.

The sensing regions SA1, SA2, and SA3 may include a first sensing region SA1, a second sensing region SA2, and a third sensing region SA3. The first to third sensing regions SA1 to SA3 may be overlapped with electronic modules. For example, the first sensing region SA1 may be overlapped with a camera module, and the second sensing region SA2 and the third sensing region SA3 may be overlapped with a proximity/illuminance sensor, but the inventive concept is not limited to this example.

Each of the electronic modules may receive an external input, which is delivered through the first sensing region SA1, the second sensing region SA2, or the third sensing region SA3 or may output a signal to the outside through the first sensing region SA1, the second sensing region SA2, or the third sensing region SA3.

In an embodiment, the first sensing region SA1 may be enclosed by the display region DA, and the second sensing region SA2 and the third sensing region SA3 may be included in the display region DA. In other words, the second sensing region SA2 and the third sensing region SA3 may be used to display an image. An optical transmittance of each of the first sensing region SA1, the second sensing region SA2, and the third sensing region SA3 may be higher than an optical transmittance of the display region DA. In addition, the optical transmittance of the first sensing region SA1 may be higher than both of the optical transmittance of the second sensing region SA2 and the optical transmittance of the third sensing region SA3.

Figure 10:
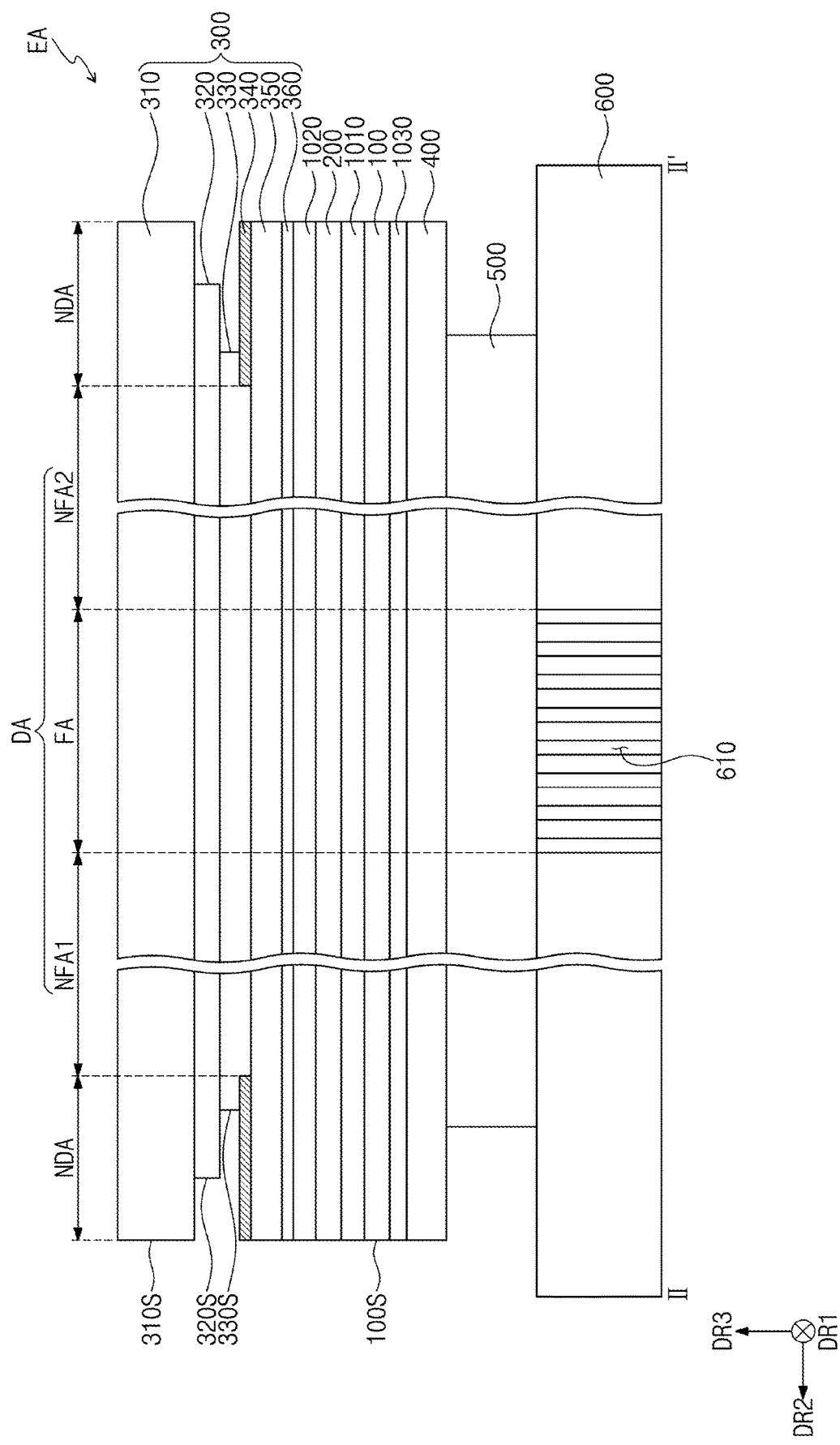
FIG. 10 is a cross-sectional view taken along a line II-II' of FIG. 9A.
Figure 11:
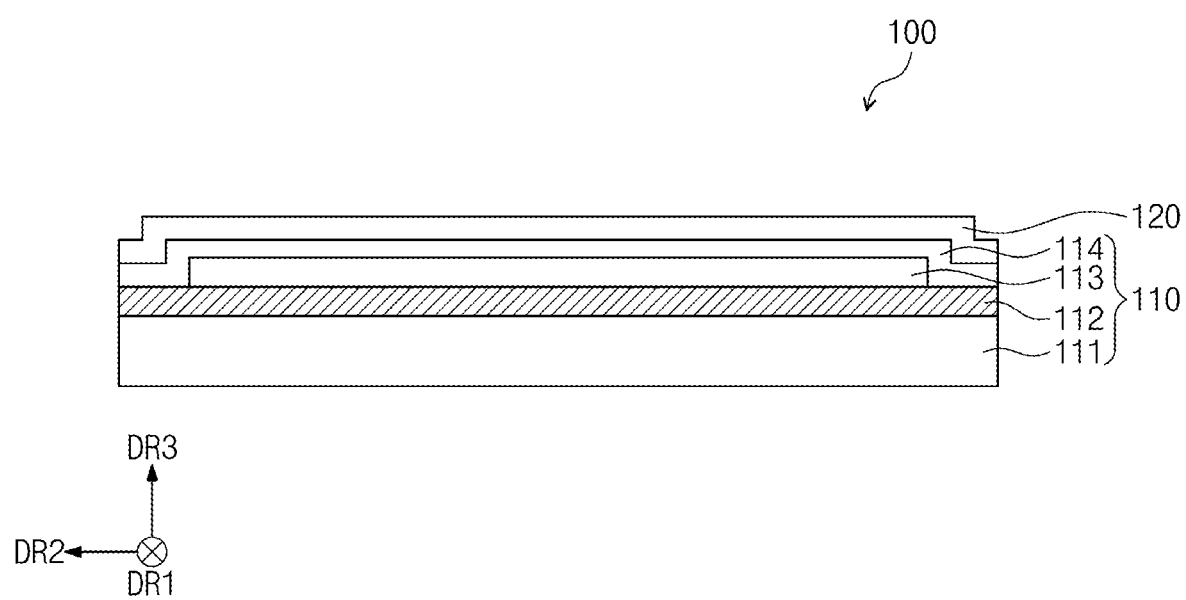
FIG. 11 is a cross-sectional view illustrating a display panel according to an embodiment of the inventive concept.

FIG. 10 is a cross-sectional view, which is taken along the line II-II' of FIG. 9A to illustrate the electronic device EA according to an embodiment of the inventive concept. FIG. 11 is a cross-sectional view illustrating a display panel 100 according to an embodiment of the inventive concept.

Referring to FIG. 10, the electronic device EA may include the display panel 100, an upper module, and a lower module.

Referring to FIG. 11, the display panel 100 may be configured to produce an image and to sense an input provided from the outside. For example, the display panel 100 may include a display layer 110 and an input-sensing sensor 120. In an embodiment, a thickness of the display panel 100 may be 30 μm, but a thickness of the display panel 100 is not limited to this value.

The display layer 110 may be an element which is used to substantially produce an image. The display layer 110 may be a light-emitting type display layer and, for example, may be an organic light-emitting display layer, a quantum dot display layer, or a micro LED display layer.

The display layer 110 may include a base layer 111, a circuit layer 112, an emission element layer 113, and an encapsulation layer 114.

In an embodiment, the base layer 111 may include a synthetic resin layer, or film. The synthetic resin layer may include a thermosetting resin. The base layer 111 may have a multi-layered structure. For example, the base layer 111 may have a triple-layered structure including a synthetic resin layer, an adhesive layer, and a synthetic resin layer. The synthetic resin layer may be a polyimide-based resin layer, but the inventive concept is not limited to a specific material. The synthetic resin layer may include at least one of acrylic resins, methacrylic resins, polyisoprene resins, vinyl resins, epoxy resins, urethane resins, cellulose resins, siloxane resins, polyamide resins, or perylene resins. In an embodiment, the base layer 111 may include a glass substrate or a substrate made of an organic/inorganic composite material.

The circuit layer 112 may be disposed on the base layer 111. The circuit layer 112 may include an insulating layer, a semiconductor pattern, a conductive pattern, a signal line, etc. The formation of the circuit layer 112 may include forming an insulating layer, a semiconductor layer, and a conductive layer on the base layer 111 using a coating or deposition method and then performing a photolithography process several times to selectively pattern the insulating layer, the semiconductor layer, and the conductive layer. Thereafter, the semiconductor pattern, the conductive pattern, and the signal line constituting the circuit layer 112 may be formed.

The emission element layer 113 may be disposed on the circuit layer 112. The emission element layer 113 may include an emission element. For example, the emission element layer 113 may include an organic light-emitting material, a quantum dot, a quantum rod, or a micro LED.

The encapsulation layer 114 may be disposed on the emission element layer 113. In an embodiment, the encapsulation layer 114 may include an inorganic layer, an organic layer, and an inorganic layer, which are sequentially stacked, but the layers constituting the encapsulation layer 114 are not limited to this example.

The inorganic layers may protect the emission element layer 113 from moisture and oxygen, and the organic layer may protect the emission element layer 113 from a contamination material (e.g., dust particles). The inorganic layers may include a silicon nitride layer, a silicon oxynitride layer, a silicon oxide layer, a titanium oxide layer, an aluminum oxide layer, or the like. The organic layer may include an acrylic organic layer, but the inventive concept is not limited to this example.

The input-sensing sensor 120 may be disposed on the display layer 110. The input-sensing sensor 120 may be configured to sense an external input provided from the outside. An example of the external input may be an input provided from a user. The external input may include any of various types of external inputs, such as a portion of a body of a user, a pen, light, heat, or pressure.

The input-sensing sensor 120 may be formed on the display layer 110 in a successive manner. For example, the input-sensing sensor 120 may be directly disposed on the display layer 110.

Referring back to FIG. 10, the upper module may be disposed on the display panel 100. For example, the upper module may include an anti-reflection layer 200 and an upper functional layer 300.

The anti-reflection layer 200 may reduce reflectance of an external light that is incident from the outside. In an embodiment, the anti-reflection layer 200 may include a stretched synthetic resin film. For example, the anti-reflection layer 200 may be formed by dyeing a polyvinyl alcohol (PVA) film with an iodine compound. However, the material of the anti-reflection layer 200 is not limited to this example. In an embodiment, a thickness of the anti-reflection layer 200 may be 31 μm, but the thickness of the anti-reflection layer 200 is not limited to this value.

The anti-reflection layer 200 may be coupled to the display panel 100 by a first adhesive layer 1010. The first adhesive layer 1010 may be a pressure-sensitive adhesive film or a transparent adhesive layer (e.g., an optically clear adhesive film or an optically clear resin film). An adhesive layer to be described below may be formed of or include at least one of typical adhesive or gluing agents. In an embodiment, a thickness of the first adhesive layer 1010 may be 25 μm, but the thickness of the first adhesive layer 1010 is not limited to this value.

In an embodiment, the first adhesive layer 1010 may be omitted, and, in this case, the anti-reflection layer 200 may be directly disposed on the display panel 100. In this case, an additional adhesive layer may not be disposed between the anti-reflection layer 200 and the display panel 100.

The upper functional layer 300 may be disposed on the anti-reflection layer 200. In an embodiment, the upper functional layer 300 may include a protection film 310, a window 320, an upper adhesive layer 330, a light-blocking layer 340, an impact absorption layer 350, and a hard coating layer 360. However, the upper functional layer 300 is not limited to having the above-described elements. For example, at least one of the above-described elements may be omitted or other elements may be added.

The protection film 310 may have a structure that is substantially similar to one of the protection film PL, PL-1, and PL-2 shown in FIGS. 6A to 8. Thus, a further detailed description of the protection film 310 will be omitted.

The window 320 may be disposed below the protection film 310. The window 320 may include an optically transparent insulating material. For example, the window 320 may include at least one of glass and synthetic resins. In the case in which the window 320 is a thin glass film, a thickness of the window 320 may be less than 80 μm or may be, for example, 30 μm, but the thickness of the window 320 is not limited to this value.

The upper adhesive layer 330 may be disposed below the window 320. The window 320 and the impact absorption layer 350 may be coupled to each other by the upper adhesive layer 330. In an embodiment, a thickness of the upper adhesive layer 330 may be 35 μm, but the thickness of the upper adhesive layer 330 is not limited to this value.

In an embodiment, a first side surface 320S, which is a side surface of the window 320, and a second side surface 330S, which is a side surface of the upper adhesive layer 330, may be disposed in an inner region, compared with side surfaces of other layers (e.g., a third side surface 100S, which is a side surface of the display panel 100, and a fourth side surface 310S, which is a side surface of the protection film 310). Here, the inner region may be closer to the display region DA than other elements.

Relative positions of layers constituting the electronic device EA may be changed during a folding operation of the electronic device EA. According to an embodiment of the inventive concept, since the first side surface 320S is disposed in the inner region compared with the third side surface 100S and the fourth side surface 310S, it is possible to suppress the outward protrusion of the first side surface 320S from the fourth side surface 310S during the folding operation of the electronic device EA. Accordingly, it is possible to prevent or suppress the window 320 from being damaged by an external impact exerted through the first side surface 320S.

In an embodiment, the window 320 and the upper adhesive layer 330 may be attached to the impact absorption layer 350 through a lamination process. Considering the process error in the lamination process, the window 320 and the upper adhesive layer 330 may have areas that are smaller than an area of the impact absorption layer 350. Also, the area of the upper adhesive layer 330 may be smaller than the area of the window 320. For example, a pressure may be exerted on the upper adhesive layer 330 during the attaching process of the window 320. The upper adhesive layer 330 may be elongated in the first and second directions DR1 and DR2 by the pressure. To prevent or substantially prevent the upper adhesive layer 330 from protruding relative to the window 320 during this process, the area of the upper adhesive layer 330 may be smaller than or equal to the area of the window 320.

The light-blocking layer 340 may be disposed between the impact absorption layer 350 and the upper adhesive layer 330. In an embodiment, the light-blocking layer 340 may be provided on the top surface of the impact absorption layer 350 by a printing process. The light-blocking layer 340 may be overlapped with a non-display region NDA. In an embodiment, the light-blocking layer 340 may be a colored layer that is formed by a coating process. In an embodiment, the light-blocking layer 340 may be formed of or include a colored organic material or an opaque metal, but the material of the light-blocking layer 340 is not limited thereto.

FIG. 10 illustrates an example in which the light-blocking layer 340 is disposed on the top surface of the impact absorption layer 350, but the position of the light-blocking layer 340 is not limited thereto. For example, the light-blocking layer 340 may be provided on a top surface of the protection film 310, a bottom surface of the protection film 310, a top surface of the window 320, or a bottom surface of the window 320. In addition, the light-blocking layer 340 may be provided to include a plurality of layers, and, in this case, at least one of the layers may be provided on the top surface of the impact absorption layer 350, and each of the remaining layers may be provided on a corresponding one of the top and bottom surfaces of the protection film 310 and the top and bottom surfaces of the window 320.

The impact absorption layer 350 may be a functional layer, which is configured to protect the display panel 100 from an external impact. The impact absorption layer 350 may be selected from films having elastic moduli higher than 1 GPa at a room temperature. In an embodiment, the impact absorption layer 350 may be a stretched film having an optical function. For example, the impact absorption layer 350 may be an optic-axis control film. In an embodiment, a thickness of the impact absorption layer 350 may be 41 μm, but the thickness of the impact absorption layer 350 is not limited to this value. In an embodiment, the impact absorption layer 350 may be omitted.

The hard coating layer 360 may be provided on a surface of the impact absorption layer 350. In an embodiment, the impact absorption layer 350 may have a curved surface. A top surface of the impact absorption layer 350 may be in contact with the upper adhesive layer 330. Thus, the curved portion on the top surface of the impact absorption layer 350 may be filled with the upper adhesive layer 330. Thus, it is possible to prevent or substantially prevent an optical issue from occurring on the top surface of the impact absorption layer 350.

The upper functional layer 300 may be coupled to the anti-reflection layer 200 by a second adhesive layer 1020. The second adhesive layer 1020 may be formed of or include at least one of typical adhesive or gluing agents. In an embodiment, a thickness of the second adhesive layer 1020 may be 25 μm, but the thickness of the second adhesive layer 1020 is not limited to this value.

The lower module may be disposed below the display panel 100. For example, the lower module may include a lower protection film 400, a cushioning layer 500, and a supporting plate 600. However, the lower module is not limited to having the above-described elements. At least one of the above-described elements may be omitted from the lower module or other elements may be added to the lower module.

The lower protection film 400 may be coupled to a rear surface of the display panel 100 by a third adhesive layer 1030. The lower protection film 400 may prevent or substantially prevent a scratch from being formed on the rear surface of the display panel 100 during a process of fabricating the display panel 100. In an embodiment, the lower protection film 400 may be a colored polyimide film. For example, the lower protection film 400 may be an opaque yellow film, but the inventive concept is not limited to this example.

In an embodiment, a thickness of the lower protection film 400 may be 40 μm, and a thickness of the third adhesive layer 1030 may be 18 μm. However, the thickness of the lower protection film 400 and the thickness of the third adhesive layer 1030 are not limited to these values.

The cushioning layer 500 may be disposed below the lower protection film 400. The cushioning layer 500 may protect the display panel 100 from an impact exerted in an upward direction. An impact-resistant property of the electronic device EA may be improved by the cushioning layer 500.

The supporting plate 600 may be disposed below the cushioning layer 500. The supporting plate 600 may be formed of or include materials having elastic moduli higher than 60 GPa at a room temperature. For example, the supporting plate 600 may be SUS304, but the inventive concept is not limited to this example. A heat-dissipation performance of the electronic device EA may be improved by the supporting plate 600.

An opening 610 may be defined in a portion of the supporting plate 600. The opening 610 may be defined in a region that is overlapped with the folding region FA. When viewed in a plan view or in the third direction DR3, the opening 610 may be overlapped with the folding region FA. Due to the presence of the opening 610, the portion of the supporting plate 600 may be more easily deformed.

In an embodiment, a thickness of the supporting plate 600 may be 150 μm, but the thickness of the supporting plate 600 is not limited to this value.

Herein, protection films according to an embodiment of the inventive concept and a comparative example will be described in more detail. However, the inventive concept is not limited by the following description.

Evaluation 1—Rainbow Mura

The display devices were tested to evaluate whether they have a recognizable rainbow mura under the linear polarization condition.

Figure 12A:
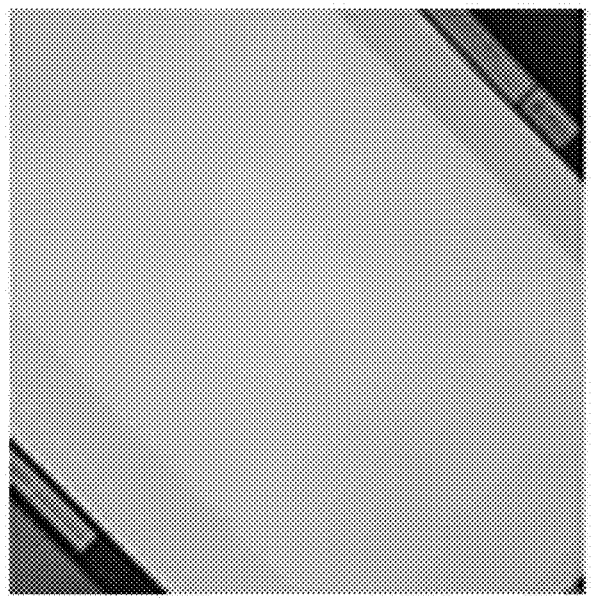
FIG. 12A is an image of a display device according to an embodiment of the inventive concept.
Figure 12B:
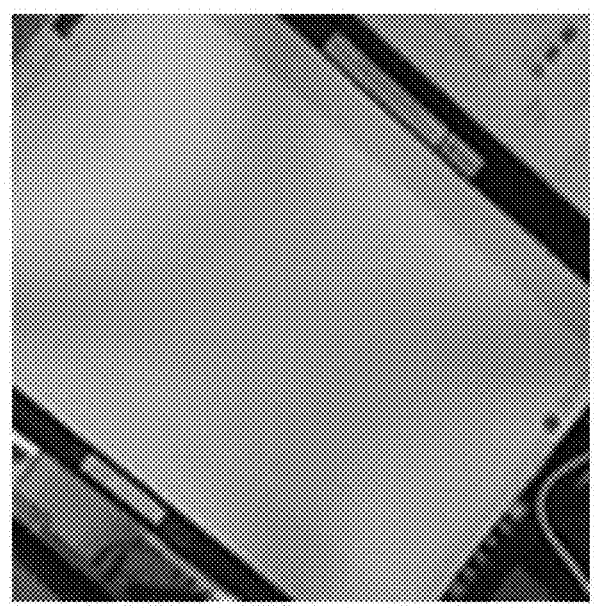
FIG. 12B is an image of a display device according to a comparative example.

FIG. 12A is an image of a display device according to an Embodiment 1. FIG. 12B is an image of a display device according to a Comparative Example 1.

In the display device according to the Embodiment 1, the base layer of the protection film was fabricated to include tri-acetyl cellulose (TAC). A phase difference of TAC was less than 10 nm.

In the display device according to the Comparative Example 1, the base layer of the protection film was fabricated to include polyethylene terephthalate (PET). A phase difference of PET was greater than 300 nm.

Referring to FIGS. 12A and 12B, the rainbow mura was not found in the display device according to the Embodiment 1, but the rainbow mura was found in the display device according to the Comparative Example 1.

Thus, in the case in which the protection film includes a base layer having a phase difference of 100 nm or less, the rainbow mura issue under the linear polarization environment can be overcome. Since the display device according to an embodiment of the inventive concept is provided to include such a protection film, the visibility of the display device under the linear polarization environment may be improved.

Evaluation 2—Vapor Permeability

The following Table 1 shows water vapor permeabilities measured from protection films according to an Embodiment 2 and a Comparative Example 2.

The protection film according to the Embodiment 2 was fabricated to include a base layer and an inorganic layer. Here, the base layer included TAC, and the inorganic layer was coated on top and bottom surfaces of the base layer.

The protection film according to the Comparative Example 2 was fabricated to include a base layer containing TAC. Top and bottom surfaces of the base layer were not coated with the inorganic layer.

TABLE 1

| Item | Embodiment 2 | Comparative Example 2 |
| --- | --- | --- |
| Water vapor permeability (g/m²·day) | Less than 180 | Greater than 1000 |

Table 1 shows that when the TAC-containing base layer was coated with the inorganic layer, the water vapor permeability was reduced to a value that is less than 180 g/m²·day. According to the Evaluations 1 and 2, in the protection film according to an embodiment of the inventive concept, the protection film can have improved visibility, because the base layer includes a small phase difference material, such as TAC. In addition, in the protection film according to an embodiment of the inventive concept, since the inorganic layer is provided on the top and bottom surfaces of the base layer with a small phase difference property, the water vapor permeability can be reduced to a value that is less than 180 g/m²·day.

According to embodiments of the inventive concept, since the display device includes the above-described protection film, the visibility and moisture permeability resistance properties of the display device may be improved.

According to embodiments of the inventive concept, the visibility and moisture permeability resistance properties of the protection film may be improved.

Further, according to embodiments of the inventive concept, due to the protection film, the reliability of the display device may be improved.

While some example embodiments of the inventive concept have been particularly shown and described, it will be understood by one of ordinary skill in the art that variations in form and detail may be made therein without departing from the spirit and scope of the attached claims.

What is claimed is:

1. A protection film, comprising:
    a base layer having a phase difference less than 100 nm;
    a first inorganic layer on a top surface of the base layer; and
    a surface coating layer on the base layer and comprising a material having a hardness higher than pencil hardness F,
    wherein the first inorganic layer is between the base layer and the surface coating layer.

2. The protection film of claim 1, wherein the base layer comprises at least one of tri-acetyl cellulose, polycarbonate, cyclo-olefin polymer, or poly (methyl methacrylate).

3. The protection film of claim 1, further comprising a second inorganic layer below a bottom surface of the base layer.

4. The protection film of claim 1, wherein a water vapor permeability of the protection film is less than 180 g/m²·day.

5. The protection film of claim 1, wherein the first inorganic layer comprises at least one of Si, Al, or Nb.

6. The protection film of claim 1, wherein the first inorganic layer is in contact with the top surface of the base layer.

7. The protection film of claim 1, wherein the base layer is configured to be folded and unfolded along at least one folding axis.

8. The protection film of claim 1, wherein a thickness of the base layer is from 10 μm to 60 μm.

9. The protection film of claim 1, wherein a thickness of the first inorganic layer is from 1 nm to 40 nm.

10. The protection film of claim 1, wherein the surface coating layer further comprises an anti-fingerprint material.

11. The protection film of claim 1, wherein the base layer comprises an ultraviolet blocking material.

12. The protection film of claim 1, wherein the material of the surface coating layer comprises at least one of a siloxane resin, an epoxy resin, or an acrylic resin.

* * * * *